United States Patent
Ho et al.

(10) Patent No.: US 9,346,205 B2
(45) Date of Patent: May 24, 2016

(54) OPTICAL DEVICE MOLDING SYSTEM

(75) Inventors: Shu Chuen Ho, Singapore (SG); Teng Hock Eric Kuah, Singapore (SG); Ji Yuan Hao, Singapore (SG); Ee Ling Chiw, Singapore (SG); See Yap Ong, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 762 days.

(21) Appl. No.: 12/578,745

(22) Filed: Oct. 14, 2009

(65) Prior Publication Data
US 2010/0090357 A1   Apr. 15, 2010

Related U.S. Application Data

(60) Provisional application No. 61/105,505, filed on Oct. 15, 2008.

(51) Int. Cl.
| | |
|---|---|
| B29D 11/00 | (2006.01) |
| B29C 45/26 | (2006.01) |
| B29C 33/68 | (2006.01) |
| B29C 45/14 | (2006.01) |
| B29C 45/02 | (2006.01) |

(52) U.S. Cl.
CPC .......... B29C 45/2608 (2013.01); B29C 33/68 (2013.01); B29C 45/02 (2013.01); B29C 45/14008 (2013.01); B29C 45/14655 (2013.01); B29C 45/2602 (2013.01); B29D 11/00807 (2013.01); *H01L 2924/0002* (2013.01)

(58) Field of Classification Search
CPC ................ B29C 45/2608; B29C 33/68; B29C 45/14008; B29C 45/14655; B29C 45/2602; B29C 45/02; B29D 11/00807; H01L 2924/0002

USPC ........... 264/1.7, 2.5, 272.14, 272.15, 272.17, 264/328.4, 328.8; 425/121, 123, 588
See application file for complete search history.

(56) References Cited

U.S. PATENT DOCUMENTS 5,672,550 A * 9/1997 Tsuji et al. ............... 264/272.17

FOREIGN PATENT DOCUMENTS

| JP | 6-106567 | * | 4/1994 |
| JP | 08-031854 | | 2/1996 |

(Continued)

OTHER PUBLICATIONS

European Search Report mailed Feb. 1, 2010 in corresponding European Application No. 09013066.7.

(Continued)

*Primary Examiner* — Mathieu Vargot
(74) *Attorney, Agent, or Firm* — Ostrolenk Faber LLP

(57) ABSTRACT

A substrate having a plurality of protrusion members on its surface is molded by a molding system comprising first and second molds cooperating to apply a clamping force onto the substrate for molding, and a middle plate located between the first and second molds such that the substrate is clamped between the middle plate and the first mold during molding. A plurality of molding cavities is located on the second mold and through-holes formed in the middle plate correspond to positions of the molding cavities, such that each through-hole is sized and configured for inserting a protrusion member of the substrate to enable each protrusion member to be in communication with a molding cavity of the second mold. Molding compound is molded onto the protrusion members by the molding cavities during molding.

17 Claims, 4 Drawing Sheets

(56) References Cited

FOREIGN PATENT DOCUMENTS

| | | |
|---|---|---|
| JP | 09-031854 | 2/1997 |
| JP | 2003-340842 | 12/2003 |
| JP | 2006-351970 | 12/2006 |
| JP | 2008-165039 | 7/2008 |
| KR | 10-0757825 | 9/2007 |
| WO | WO 2007/007959 | 1/2007 |

OTHER PUBLICATIONS

Japanese Office Action dated Jun. 14, 2011 with an English translation for JP 2009-236457.

English translation of a Third Party Observation filed in the corresponding Japanese application JP 2009-236457.

* cited by examiner

OPTICAL DEVICE MOLDING SYSTEM

CROSS REFERENCE TO RELATED APPLICATION

This application claims the benefit and priority of U.S. Provisional Application Ser. No. 61/105,505 filed on Oct. 15, 2008, and entitled OPTICAL DEVICE MOLDING SYSTEM, the disclosure of which is incorporated herein by reference.

FIELD OF THE INVENTION

The present invention relates to a molding system for electronic devices, and in particular to a molding system suitable for molding electronic devices including optical elements.

BACKGROUND AND PRIOR ART

For electronic devices with optical elements, such as light-emitting diode ("LED") devices, the optical element is typically molded with a layer of transparent or translucent molding compound. In prior art molding systems for such electronic devices, the said molding compound is usually molded by either dispensing the molding compound into molding cavities directly, or by injection molding. However, it has been found that both these approaches offer unsatisfactory yield and productivity, and the precision of the processes has been lacking. Material waste is sometimes also substantial.

More recently, compression molding has provided a viable solution for panel type packages, but compression molding requires flow paths to link all the single units, which may cause contamination on the substrate's electrical contacts. It would be desirable to harness the positive aspects of transfer molding in order to avoid some of the disadvantages faced when dispensing molding compound for molding.

SUMMARY OF THE INVENTION

It is thus an object of the invention to seek to provide a molding system using a liquid molding compound to mold the optical elements of electronic devices while overcoming some of the disadvantages found in the aforesaid prior art molding systems.

According to a first aspect of the invention, there is provided a molding system for a substrate having a plurality of protrusion members on its surface, the molding system comprising: first and second molds cooperating to apply a clamping force onto the substrate for molding; a middle plate located between the first and second molds such that the substrate is clamped between the middle plate and the first mold during molding; a plurality of molding cavities located on the second mold; and through-holes formed in the middle plate corresponding to positions of the molding cavities, each through-hole being sized and configured for inserting a protrusion member of the substrate to enable each protrusion member to be in communication with a molding cavity of the second mold; wherein molding compound is molded onto the protrusion members by the molding cavities during molding.

According to a second aspect of the invention, there is provided a method of molding a substrate having a plurality of protrusion members on its surface, comprising the steps of: providing first and second molds and a middle plate located between the first and second molds; locating the substrate between the middle plate and the first mold while inserting the protrusion member into through-holes formed in the middle plate to enable the protrusion members to be in communication with molding cavities formed in the second mold; applying a clamping force onto the substrate; and then forming molding compound onto the protrusion members during molding.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

An example of a molding system according to the preferred embodiment of the invention will now be described with reference to the accompanying drawings, in which.

DETAILED DESCRIPTION OF THE PREFERRED EMBODIMENT OF THE INVENTION

Figure 1:
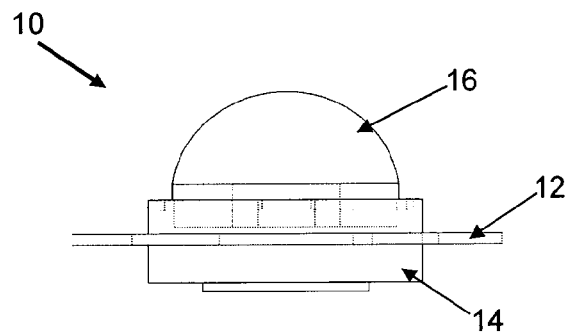
FIG. 1 is a side view of an encapsulated LED device.

FIG. 1 is a side view of an encapsulated LED device 10. The LED device 10 comprises a substrate 12 supporting the device, a protrusion member such as a pre-molded cap 14 on the surface of the substrate on which an LED chip (not shown) is mounted, and a dome-shaped lens 16 formed from a transparent material such as silicone molded on top of the pre-molded cap 14 to encapsulate the LED chip.

Figure 2:
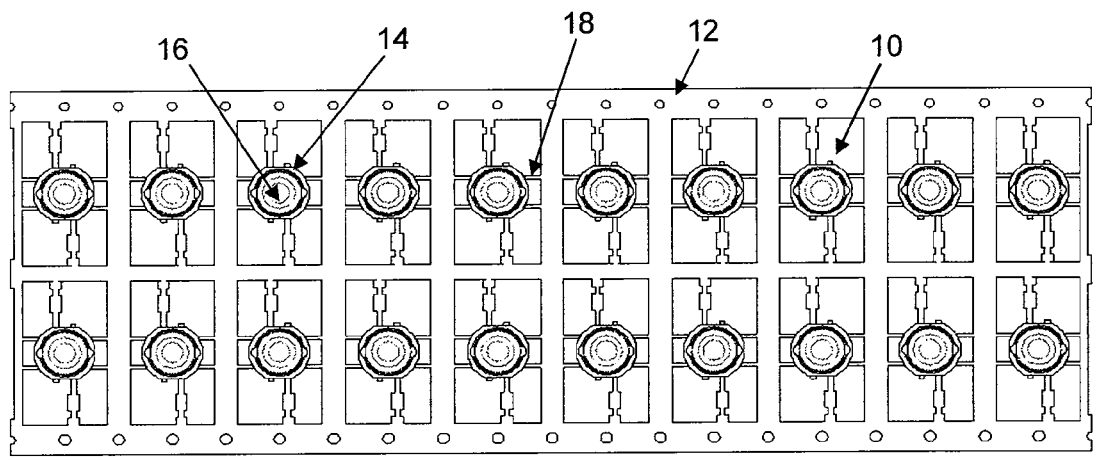
FIG. 2 is a plan view of a plurality of LED devices mounted on a lead frame substrate.

FIG. 2 is a plan view of a plurality of LED devices 10 mounted on a lead frame substrate 12. The plurality of LED devices 10 are arranged in two rows. Each LED device 10, comprising the pre-molded cap 14 and dome-shaped lens 16, is connected to the rest of the lead frame substrate 12 by tie bars 18. To remove each LED device 10, the LED device 10 is cut from the tie bars 18.

Figure 3:
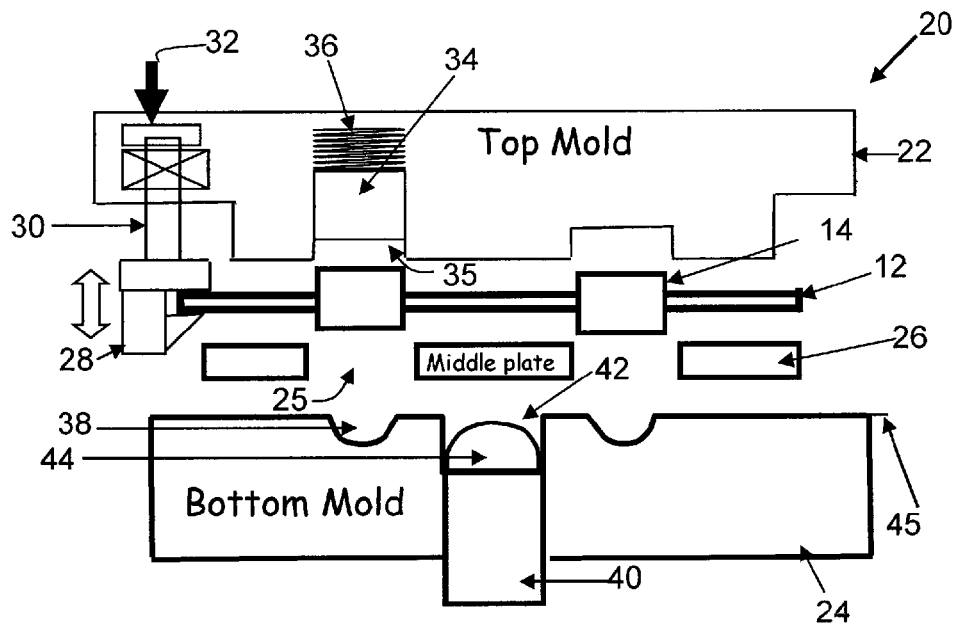
FIG. 3 is a schematic sectional view of a transfer-molding system according to the preferred embodiment of the invention for encapsulating LED devices.

FIG. 3 is a schematic sectional view of a transfer-molding system 20 according to the preferred embodiment of the invention for encapsulating LED devices 10. The molding system 20 includes a first or top mold 22 and a second or bottom mold 24. The top mold 22 may be configured to be movable relative to the bottom mold 24 to apply a clamping force onto the substrate 12 for molding. A middle plate 26 is located between the top mold 22 and the bottom mold 24 such that the substrate 12 is clamped between the middle plate 26 and the top mold 22 during molding. The middle plate 26 comprises a number of through-holes 25, each of which is sized and configured to fittingly insert a pre-molded cap 14 of the LED device 10 into the through-hole. This feature helps to prevent molding compound from entering the sides of the pre-molded cap 14.

The top mold 22 further supports a track plate 28, which extends from the top mold 22 by means of a support rod 30, for gripping a side of the substrate 12. The track plate 28 is operative to move the substrate 12 vertically up or down between the top mold 22 and the middle plate 26. Only one side of the track plate 28 is shown, but there should be a similar track plate at the opposite end of the substrate 12 so that both sides of the substrate 12 are held simultaneously. An actuation force 32 may be provided by a motor above the top mold 22 for lifting and lowering the track plate 28. The track plate 28 holds the substrate 12 while the middle plate 26 covers substantially the whole substrate 12 with only the pre-molded caps 14 being exposed.

Supporters 34 are located inside blind holes 35 formed on the surface of the top mold 22 corresponding to positions of the LED devices 10. The pre-molded caps 14 are inserted on their top sides into the blind holes 35. Each supporter 34 is spring-loaded by resilient means, such as a spring 36. The supporter 34 applies a compression force on the pre-molded cap 14 to press the pre-molded cap 14 tightly onto the middle plate 26 in a direction towards the cavity 38 when molding compound is being molded onto the pre-molded cap 14. It prevents leakage of the molding compound.

The bottom mold 24 has a plurality of molding cavities located on it. The molding cavities preferably comprise two rows of cavities 38 corresponding to the two rows of LED devices 10 found on the substrate 12. The positions of the through-holes 25 formed in the middle plate 26 correspond to the positions of the cavities 38, so that each one of the pre-molded caps 14 inserted into a through-hole carrying an LED chip is located onto each one of the cavities 38 for communication with the cavity 38 during molding. A plunger pot 42 and plunger 40 located centrally of the two rows of cavities 38 are operative to receive and to transfer molding compound, which is liquid silicone 44 in the preferred embodiment, to the cavities 38. Accordingly, the molding compound is molded onto the pre-molded caps 14 by the cavities 38 during molding.

A two-component dispenser with a static mixer which is mounted on an X-Y positioning table is movable over the bottom mold 24 in order to dispense a line of mixed liquid silicone 44 into the plunger pot 42. The bottom mold 24 is covered by a release film 45 which is extended across the cavities 38 and the plunger pot 42. This helps in the separation of the molded LED devices 10 from the bottom mold 24 after molding.

Figure 4:
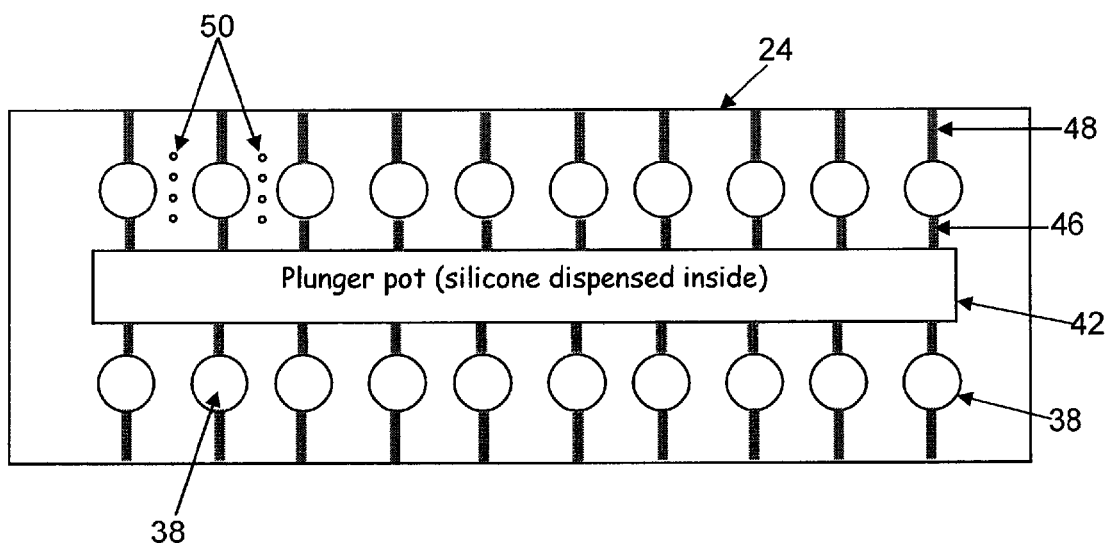
FIG. 4 is a plan view of a bottom mold of the molding system of FIG. 3.

FIG. 4 is a plan view of the bottom mold 24 of the molding system 20 of FIG. 3. The molding cavities 38 are arranged in two rows, in the same arrangement as the LED devices 10 are arranged on the lead frame substrate 12. The plunger pot 42 in the form of an elongated channel is located centrally between the two rows of cavities 38, and there are runners 46 linking the plunger pot 42 to the cavities 38. The plunger 40 may be located at the side or centre of the plunger pot 42 for compressing the liquid silicone 44 in the plunger pot 42. When the plunger 40 compresses the liquid silicone 44 in the plunger pot 42 during molding, the liquid silicone 44 is expelled from the plunger pot 42 to the runners 46, and is thus distributed from the plunger pot 42 to the cavities 38 through the runners 46. Air vents 48 linking the cavities 38 to the external atmosphere exhaust air from the cavities 38 and they prevent air bubbles from being formed in the cavities 38. Furthermore, there are vacuum holes 50 positioned on the surface of the bottom mold 24 to suck down and to secure the release film 45 in order to ensure a tight fit with the bottom mold's surface contours.

Figure 5:
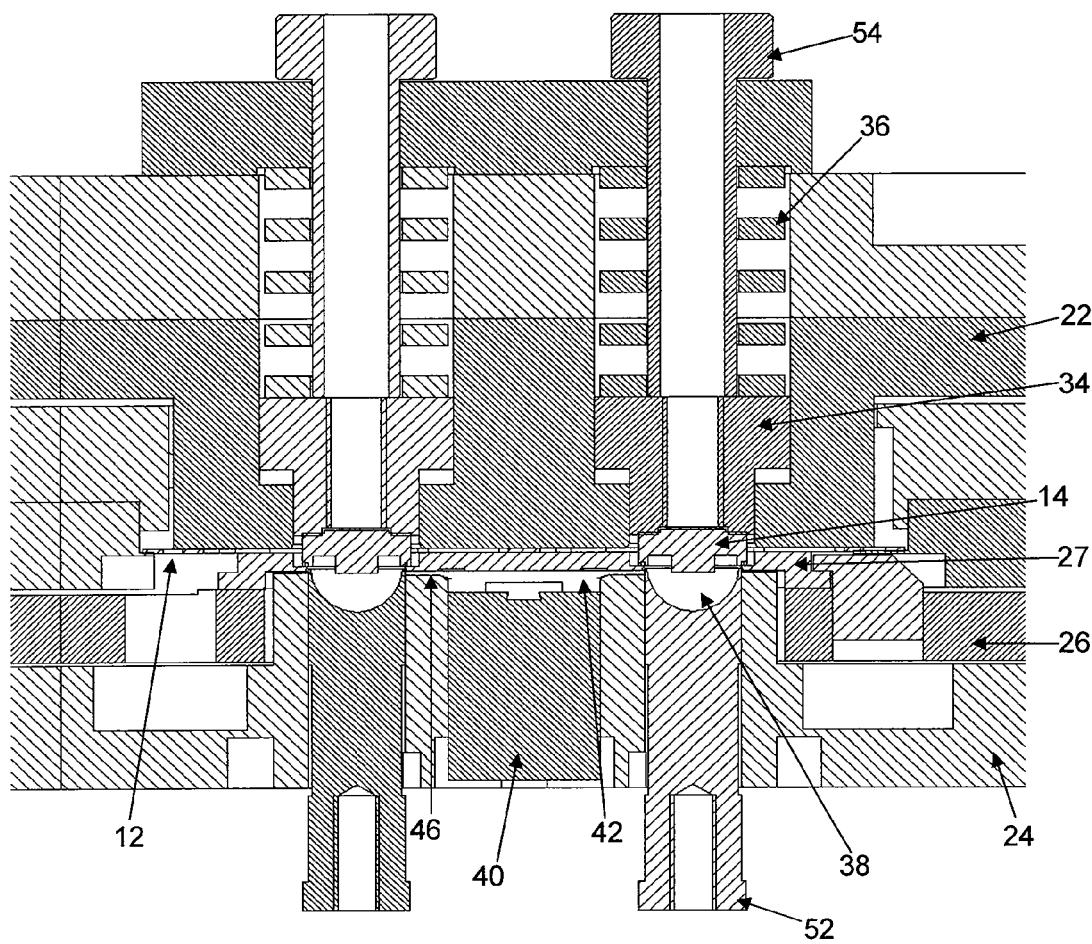
FIG. 5 is a cross-sectional view illustrating spring forces exerted on a pre-molded cap carrying an LED chip to be encapsulated.

FIG. 5 is a cross-sectional view illustrating spring forces exerted on a pre-molded cap 14 carrying an LED chip to be encapsulated. The middle plate 26 has been moved onto the bottom mold 24, and the lead frame substrate 12 has been placed onto the middle plate 26. In this illustration, the pre-molded caps 14 are inserted into the through-holes 25 formed in a middle plate insert 27 formed in the middle plate 26, and the rest of the substrate 12 rests on the middle plate 26. Hence, the middle plate 26 substantially covers the whole surface of the substrate 12 except for the positions of the pre-molded caps 14. The top mold 22 is closed onto the substrate 12 resting on the middle plate 26.

This drawing also illustrates that the cavities 38 in the bottom mold 24 are formed from the dome-shaped recesses of cavity inserts 52 which are detachably insertable into the bottom mold 24. This enables the cavity inserts 52 to be replaced and substituted for molding different dome sizes onto the pre-molded cap 14. On the opposite side of the pre-molded cap 14, the supporter 34 is biased by the spring 36 to push against the pre-molded cap 14 in order to form a sealing effect on the cavity 38. A distance bush 54 controls the extent of contraction of the spring 36. At this point, the plunger 40 pushes upwards into the plunger pot 42 to force the liquid silicone 44 into the runners 46 and then into the cavities 38, thereby encapsulating the LED devices 10.

The bottom surface of the middle plate 26 which contacts the liquid silicone 44 is preferably coated with an optical metal coating on selected areas which prevent liquid silicone 44 from sticking to the metal surface of the middle plate 26. The surfaces of the bottom mold 24 are covered by the release film 45, and do not face the same problem of liquid silicone 44 adhering to it.

Figure 6:
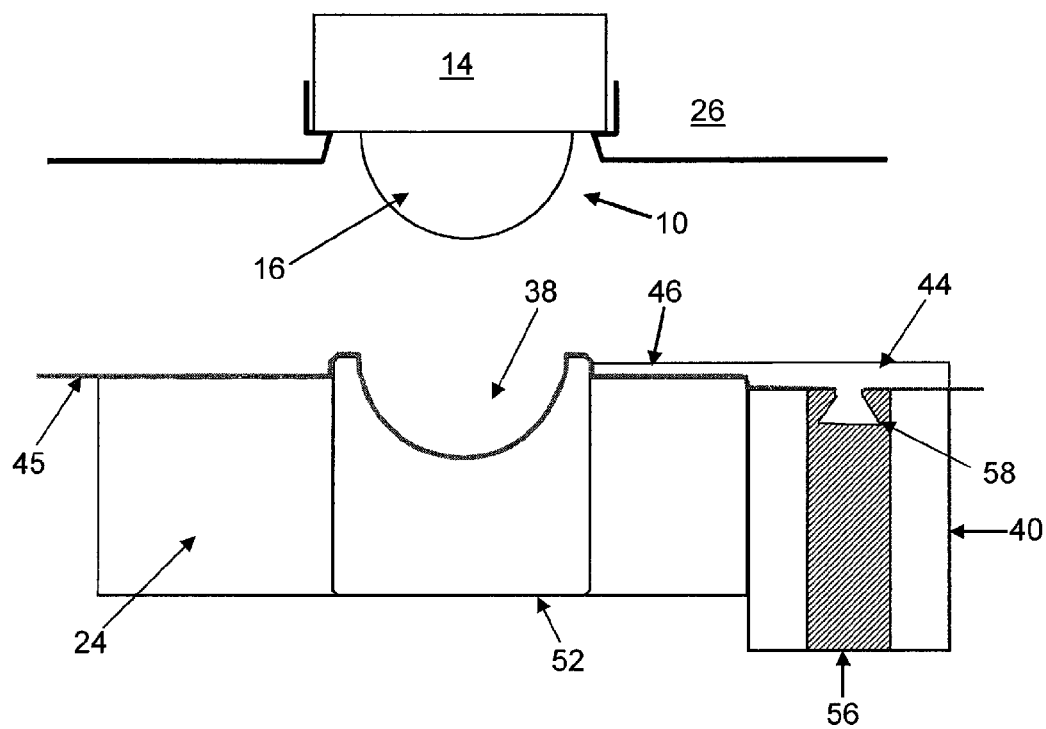
FIG. 6 shows the molded LED device which is lifted together with a middle plate of the molding system after encapsulation.

FIG. 6 shows the molded LED device 10 which is lifted together with a middle plate 26 of the molding system 20 after encapsulation. In this illustration, the plunger 40 incorporates a locking insert 56 which has a locking feature 58 at the position where the locking insert 56 contacts the liquid silicone 44. The locking feature 58 may comprise one or two angular hook-like recesses, and is operative to adhere the molding compound to the plunger 40. During molding, some of the liquid silicone 44 will enter the locking feature 58. After molding, when the middle plate 26 is lifted away from the bottom mold 24, the locking feature ensures that cull comprising the liquid silicone 44 that remains in the runner 46 and plunger pot 42 separate from the middle plate 26 and is retained on the release film 45. On the other hand, the liquid silicone 44 molded in the cavities 38 is removed together with the removal of the pre-molded cap 14. Furthermore, the suction features on the bottom mold 24, namely the vacuum holes 50, ensure that the release film 45 remains on the bottom mold 24 when the middle plate 26 is separated from it. Since the liquid silicone 44 sticks to the release film 45, it can be removed together with the used release film 45.

The substrate 12 with the molded dome-shaped lenses 16 may now be lifted away from the middle plate 26 by the track plates 28. The substrate 12 may then be removed from the molding system 20 for further processing, such as for severing each of the individual LED devices 10 from the substrate 12.

It should be appreciated that the preferred embodiment of the invention introduces a combination of dispensing and transfer molding to perform encapsulation of electronic devices in the form of light-emitting devices. With the described approach, precise control of the final shape of an LED device 10 is possible. Consequently, LED devices 10 with improved quality of light emission may be manufactured.

The invention described herein is susceptible to variations, modifications and/or additions other than those specifically described and it is to be understood that the invention includes all such variations, modifications and/or additions which fall within the spirit and scope of the above description.

The invention claimed is:

1. Molding system for a substrate having a plurality of protrusion members on its surface, each protrusion member having a molding side for mounting a light-emitting diode (LED) chip thereto, the molding system comprising:
   first and second molds cooperating to apply a clamping force onto the substrate for molding;
   a middle plate located between the first and second molds which is movable relative to the first and second molds, and configured such that the substrate is clamped between the middle plate and the first mold during molding;
   a plurality of molding cavities located on the second mold;
   through-holes formed in the middle plate corresponding to positions of the molding cavities, each through-hole being sized and configured for inserting a respective one of the plurality of protrusion members of the substrate to enable the protrusion member to communicate with a respective one of the plurality of molding cavities of the second mold, and to form a seal around a molding side of the protrusion member to prevent leakage of the molding compound from the molding side of the protrusion member to other non-molding sides of the protrusion member;
   a plurality of holes located on the first mold, each of the plurality of holes is sized for inserting and receiving a respective protrusion member; and
   a plurality of supporters, each of the plurality of supporters being located within a respective hole and biased by resilient devices to push the protrusion members towards the molding cavities on the second mold;
   wherein the second mold comprises a plunger pot in the form of an elongated channel which is operative to receive the molding compound for molding, runners connecting the plunger pot to the plurality of molding cavities, and a plunger for expelling the molding compound from the plunger pot into the plurality of molding cavities through the runners to encapsulate said portion of the respective molding side of each of the plurality of protrusion members.

2. Molding system as claimed in claim 1, wherein the molding cavities are arranged in separate rows and the plunger pot is centrally located between the separate rows of molding cavities.

3. Molding system as claimed in claim 1, further comprising a dispenser movable over the plunger pot which is operative to dispense molding compound into the plunger pot.

4. Molding system as claimed in claim 1, wherein the plunger comprises a locking feature which is operative to adhere the molding compound to the plunger after molding so as to facilitate the separation of the molding compound in the molding cavities from cull.

5. Molding system as claimed in claim 4, wherein the locking feature comprises one or more angular hook-like recesses on a surface of the plunger.

6. Molding system as claimed in claim 1, further comprising a track plate guided by a support rod for gripping a side of the substrate, and which is operative to move the substrate vertically between the first mold and the middle plate.

7. Molding system as claimed in claim 1, wherein the middle plate substantially covers the whole surface of the substrate except for positions of the protrusion members.

8. Molding system as claimed in claim 1, wherein the holes comprise blind holes.

9. Molding system as claimed in claim 1, wherein the molding compound is silicone and the molding compound forms a lens on each protrusion member after molding.

10. Molding system as claimed in claim 1, wherein the molding cavities are formed on inserts which are detachably insertable in the second mold.

11. Molding system as claimed in claim 1, wherein a surface of the middle plate which contacts the molding compound is coated with a coating which is operative to prevent molding compound from sticking to the middle plate.

12. Method of molding a substrate having a plurality of protrusion members on its surface, each protrusion member having a molding side for mounting a light-emitting diode (LED) chip thereto, the method comprising the steps of:
   providing first and second molds and a middle plate located between the first and second molds;
   locating a plurality of holes on the first mold, each of the plurality of holes being sized for inserting and receiving a respective protrusion member; and
   locating a respective supporter within each hole and pushing the protrusion members towards the molding cavities on the second mold with the supporters being biased by resilient devices;
   locating the substrate between the middle plate and the first mold while inserting the plurality of protrusion members into through-holes formed in the middle plate to enable the plurality of protrusion members to be in communication with respective ones of a plurality molding cavities formed in the second mold, and to form seals around respective molding sides of the plurality of protrusion members to prevent leakage of the molding compound from the molding sides of the protrusion members to other non-molding sides of the protrusion members;
   applying a clamping force onto the substrate; and then
   encapsulating a portion of the molding side of each of the plurality of protrusion members with a molding compound during molding,
   wherein the second mold comprises a plunger pot in the form of an elongated channel which has molding compound for molding, runners connecting the plunger pot to the plurality of molding cavities, and a plunger, and that the step of encapsulating the plurality of protrusion members includes pushing the plunger into the plunger pot to force the molding compound into the runners and subsequently into the plurality of molding cavities to thereby encapsulate the respective portions of the molding sides of the plurality of protrusion members.

13. Method of molding a substrate as claimed in claim 12, further comprising dispensing molding compound into plunger pot in the form of an elongated channel before applying a clamping force onto the substrate, the plunger pot being connected to the molding cavity by runners.

14. Method of molding a substrate as claimed in claim 12, further comprising the step of gripping a side of the substrate with a track plate guided by a support rod, and moving the substrate linearly between the first mold and the middle plate to position the substrate for clamping.

15. Method of molding a substrate as claimed in claim 12, wherein the middle plate substantially covers a surface of the whole substrate except for the protrusion members.

16. Method of molding a substrate as claimed in claim 12, wherein the holes comprise blind holes.

17. Method of molding a substrate as claimed in claim 12, wherein the molding compound is silicone and the molding compound forms a lens on each protrusion member after molding.

* * * * *